US006310301B1

United States Patent
Heinrich et al.

(10) Patent No.: US 6,310,301 B1
(45) Date of Patent: Oct. 30, 2001

(54) INTER-SUBSTRATE CONDUCTIVE MOUNT FOR A CIRCUIT BOARD, CIRCUIT BOARD AND POWER MAGNETIC DEVICE EMPLOYING THE SAME

(76) Inventors: Randy T. Heinrich, 11350 Drummond, Dallas, TX (US) 75228; Robert J. Roessler, 6905 Graham Dr., Rowlett, TX (US) 75088; Thang D. Truong, 554 Clayton St., Grand Prairie, TX (US) 75052; Matthew A. Wilkowski, 2339 Heatherdale Dr., Mesquite, TX (US) 75150; William L. Woods, Jr., 9453 County Road 133, Kaufman, TX (US) 75142

( * ) Notice: Subject to any disclaimer, the term of this patent is extended or adjusted under 35 U.S.C. 154(b) by 0 days.

(21) Appl. No.: 09/288,749

(22) Filed: Apr. 8, 1999

(51) Int. Cl.$^7$ ........................................ H05K 1/16
(52) U.S. Cl. ............................ 174/260; 174/262
(58) Field of Search ............................ 174/260, 261, 174/262, 263; 361/760, 767, 772

(56) References Cited

U.S. PATENT DOCUMENTS

| 5,541,828 | 7/1996 | Rozman | 363/21 |
|---|---|---|---|
| 5,588,848 | 12/1996 | Law et al. | 439/83 |
| 5,724,016 | 3/1998 | Roessler et al. | 336/65 |
| 5,750,935 | 5/1998 | Stevens | 174/138 G |
| 5,764,485 | * 6/1998 | Lebaschi | 361/774 |
| 5,787,569 | 8/1998 | Lotfi et al. | 29/602.1 |
| 5,835,350 | 11/1998 | Stevens | 361/704 |
| 5,872,400 | * 2/1999 | Chapman et al. | 257/738 |
| 5,926,373 | 7/1999 | Stevens | 361/704 |
| 6,002,172 | * 12/1999 | Desai et al. | 257/737 |
| 6,137,164 | * 10/2000 | Yew et al. | 257/686 |

OTHER PUBLICATIONS

U.S. Patent Application entitled "Methods of Manufacturing a Power Magnetic Device and Tool for Manfacturing the Same" by Roessler. et al.; Ser. No. 08/777,342; Filed Dec. 27, 1996.

U.S. Patent Application entitled "Board–Mountable Power Supply Module" by Rozman, et al.; Ser. No. 08/879,478; Filed Jun. 20, 1997.

U.S. Patent Application entitled "Methods of Manfacturing a Magnetic Device and Tool for Manufacturing the Same" by Roessler, et al.; Ser. No. 08/908,887; Filed Aug. 8, 1997.

U.S. Patent Application entitled "Power Magnetic Device Employing a Leadless Connection to a Printed Circuit Board and Method of Manufacture Thereof" by Pitzele, et al.; Ser. No. 08/940,557; Filed Sep. 30, 1997.

U.S. Patent Application entitled "Post–Mountable Planar Magnetic Device and Method of Manfacture Thereof" by Pitzele, et al.; Ser. No. 08/940,672; Filed Sep. 30, 1997.

(List continued on next page.)

Primary Examiner—Jeffrey Gaffin
Assistant Examiner—Jeremy Norris

(57) ABSTRACT

An inter-substrate conductive mount for a surface mountable circuit board, a method of manufacturing the circuit board and a surface mountable power magnetic device. In one embodiment, the circuit board includes: (1) a substrate, (2) an inter-substrate conductive mount composed of a material having a melting point above a solder reflow temperature and including a compliant solder joint at an interface of the substrate and (3) a solder located proximate the conductive mount, the conductive mount of a sufficiently low weight such that a surface tension of a liquid state of the solder is sufficient to maintain the conductive mount in contact with the substrate as the solder is brought to the reflow temperature, the conductive mount being capable of mounting the substrate to an adjacent substrate and providing a conductive path therebetween.

16 Claims, 5 Drawing Sheets

OTHER PUBLICATIONS

U.S. Patent Application entitled "Power Magnetic Device Employing a Leadless Connection to a Printed Circuit Board and Method of Manufacture Thereof" by Pitzele, et al.; Ser. No. 09/045,217; Filed Mar. 20, 1998.

U.S. Patent Application entitled "Encapsulated, Board-Mountable Power Supply and Method of Manufacture Therefor" by Stevens; Ser. No. 09/126,183; Filed Jul. 30, 1998.

U.S. Patent Application entitled "Lead–Free Solder Process for Printed Wiring Boards" by Pilukaitis, et al.; Ser. No. 09/184,753; Filed Nov. 2, 1998.

U.S. Patent Application entitled "Surface Mountable Power Supply Module and Method of Manfacture Therefor" by Heinrich, et al.; Ser. No. 09/288,750; Filed Apr. 8, 1999.

* cited by examiner

INTER-SUBSTRATE CONDUCTIVE MOUNT FOR A CIRCUIT BOARD, CIRCUIT BOARD AND POWER MAGNETIC DEVICE EMPLOYING THE SAME

CROSS-REFERENCE TO RELATED APPLICATIONS AND PATENTS

This application is related to the following U.S. patents and applications:

| Reference No. | Title | Inventor(s) | Date |
|---|---|---|---|
| 08/777,342 ('342 application) | Methods of Manufacturing a Power Magnetic Device and Tool for Manufacturing The Same | Roessler, et al. | Filed Dec. 27, 1996 |
| 08/879,478 ('478 application) | Board-Mountable Power Supply Module | Rozman, et al. | Filed June 20, 1997 |
| 08/908,887 ('887 application) | Methods of Manufacturing a Magnetic Device and Tool for Manufacturing the Same | Roessler, et al. | Filed Aug. 8, 1997 |
| 08/940,557 ('557 application) | Power Magnetic Device Employing a Leadless Connection to a Printed Circuit Board and Method of Manufacture Thereof | Pitzele, et al. | Filed Sept. 30, 1997 |
| 08/940,672 ('672 application) | Post-mountable Planar Magnetic Device and Method of Manufacture Thereof | Pitzele, et al. | Filed Sept. 30, 1997 |
| 09/045,217 ('217 application) | Power Magnetic Device Employing a Leadless Connection to a Printed Circuit Board and Method of Manufacture Thereof | Pitzele, et al. | Filed Mar. 20, 1998 |
| 09/126, 183 ('183 application) | Encapsulated, Board-mountable Power Supply and Method of Manufacture Therefor | Stevens | Filed July 30, 1998 |
| 09/184,753 ('753 application) | Lead-free Solder Process for Printed Wiring Boards | Pilukaitis, et al. | Filed Nov. 2, 1998 |
| Heinrich 1-24-2-16 | Surface Mountable Power Supply Module and Method of Manufacture Therefor | Heinrich, et al. | Filed April, 1999 |
| 5,541,828 ('828 patent) | Multiple Output Converter with Continuous Power Transfer to an Output and with Multiple Output Regulation | Rozman | Issued July 30, 1996 |
| 5,588,848 ('848 patent) | Low inductance surface mount connectors for interconnecting circuit devices and method for using same. | Law, et al. | Issued Dec 31, 1996 |
| 5,724,016 ('016 patent) | Power Magnetic Device Employing a Compression-mounted Lead to a Printed Circuit Board | Roessler, et al. | Issued Mar. 3, 1998 |
| 5,750,935 ('935 patent) | Mounting Device for Attaching a Component Through an Aperture in a Circuit Board | Stevens | Issued May 12, 1998 |
| 5,787,569 ('569 patent) | Encapsulated Package for Power Magnetic Devices and Method of Manufacture Therefor | Lotfi, et al. | Issued Aug. 4, 1998 |
| 5,835,350 ('530 patent) | Encapsulated, Board-mountable Power Supply and Method of Manufacture Therefor | Stevens | Issued Nov. 10, 1998 |

The above-listed applications and patents are commonly assigned with the present invention and are incorporated herein by reference as if reproduced herein in their entirety.

TECHNICAL FIELD OF THE INVENTION

The present invention is directed, in general, to electronic devices and, more specifically, to a surface mountable circuit board and a method of manufacturing therefor.

BACKGROUND OF THE INVENTION

Electronic devices for power supplies and other electronic assemblies are conventionally provided in a protective package. The packaged electronic devices are conventionally mounted directly to a circuit board, the devices cooperating to form a circuit functioning, perhaps, as a power supply.

As with other types of electronic components, the trend in the design of power supplies has been towards achieving an increased power and device density and a lower device profile. Since many surface-mount devices are typically smaller than traditional through-hole devices, one way to achieve higher device density is to employ surface-mount electronic devices, to the exclusion of the larger through-hole mounted devices.

Some complex circuits may require more board real estate than is available with a single circuit board. Many designs, therefore, employ an auxiliary circuit board mounted to a primary circuit board. Electronic devices may then be surface mounted to both the primary and auxiliary circuit boards, significantly increasing device density. In designs requiring multiple circuit boards, the circuit boards are typically assembled separately using conventional automated pick-and-place equipment. The circuit boards are then mounted together in a separate manufacturing step. The auxiliary circuit board is typically mountable to the primary circuit board via through-hole pins. The leads of the auxiliary circuit board are typically soldered to the primary circuit card manually.

Since the primary circuit board typically contains a large number of surface mount components, the auxiliary circuit board may be the only through-hole mounted component on the primary circuit board. A separate or additional manufacturing step is thus required to mount the auxiliary circuit board to the primary circuit board, thereby increasing the complexity and overall cost of the electronic assembly incorporating the circuit boards.

Accordingly, what is needed in the art is a circuit board capable of being surface mounted to another circuit board using the same reflow soldering process used to mount the other surface mount electronic devices.

SUMMARY OF THE INVENTION

To address the above-discussed deficiencies of the prior art, the present invention provides an inter-substrate conductive mount for a surface mountable circuit board, a method of manufacturing the circuit board and a surface mountable power magnetic device. In one embodiment, the circuit board includes: (1) a substrate, (2) an inter-substrate conductive mount composed of a material having a melting point above a solder reflow temperature and including a compliant solder joint at an interface of the substrate and (3) a solder located proximate the conductive mount, the conductive mount of a sufficiently low weight such that a surface tension of a liquid state of the solder is sufficient to maintain the conductive mount in contact with the substrate as the solder is brought to the reflow temperature, the conductive mount being capable of mounting the substrate to an adjacent substrate and providing a conductive path therebetween.

The present invention, in one aspect, introduces the broad concept of an inter-substrate conductive mount for a surface mountable circuit board. The conductive mount has a compliant solder joint that improves the co-planarity of the circuit board during the reflow soldering process.

In one embodiment of the present invention, the substrate includes a conductive layer and a via coupled in electrical communication therewith. The conductive mount may, therefore, be located proximate the via. Those skilled in the art are familiar with through-hole vias in circuit boards. In a related embodiment, the conductive mount has a compound curved surface thereon. The conductive mount may, therefore, be partially recessed in the via to cause the compound curved surface to contact a proximal perimeter of the via. Of course, the broad scope of the present invention is not limited to a conductive mount of a specific geometry.

In one embodiment of the present invention, the substrate is selected from the group consisting of an epoxy-glass substrate, a paper phenolic substrate, and an insulated metal substrate. In a preferred embodiment, the substrate is an FR4 substrate. Those skilled in the pertinent art are familiar with a variety of substrate materials.

In one embodiment of the present invention, the conductive mount is selected from the group consisting of a hollow tin/lead plated copper ball, a solid ball composed of high temperature solder and a solid metal ball. Of course, the conductive mount may be of any geometry, including any substantially spherical, cylindrical or toroidal shape. Alternatively, the conductive mount may have a substantially cubical or rectangular shape. In either case, the conductive mount is of a sufficiently low weight such that a surface tension of the liquid state of the solder is sufficient to maintain the conductive mount in contact with the lower conductive layer as the circuit board passes through the reflow soldering process.

In one embodiment of the present invention, the solder is a tin/lead solder composition. The solder, therefore, will transition to a liquid state as the circuit board passes through the reflow soldering process. In a related embodiment, the tin/lead solder composition is selected from the group consisting of a 60/40 Sn/Pb composition and a 63/37 Sn/Pb composition. The present invention may advantageously avoid the use of high temperature, lead-free solder, although such materials may be readily employed as required by an application.

In one embodiment of the present invention, the circuit board further includes an electrical component having a lead mounted on a pad on the conductive layer. The electrical component may be a power device, a magnetic device or other devices as required by a particular application.

In one embodiment of the present invention, the conductive mount is compatible with a through-hole mounting hole on the adjacent substrate. The conductive mount may thus enable the circuit board to be mounted to the adjacent substrate via the through-hole mounting hole, The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
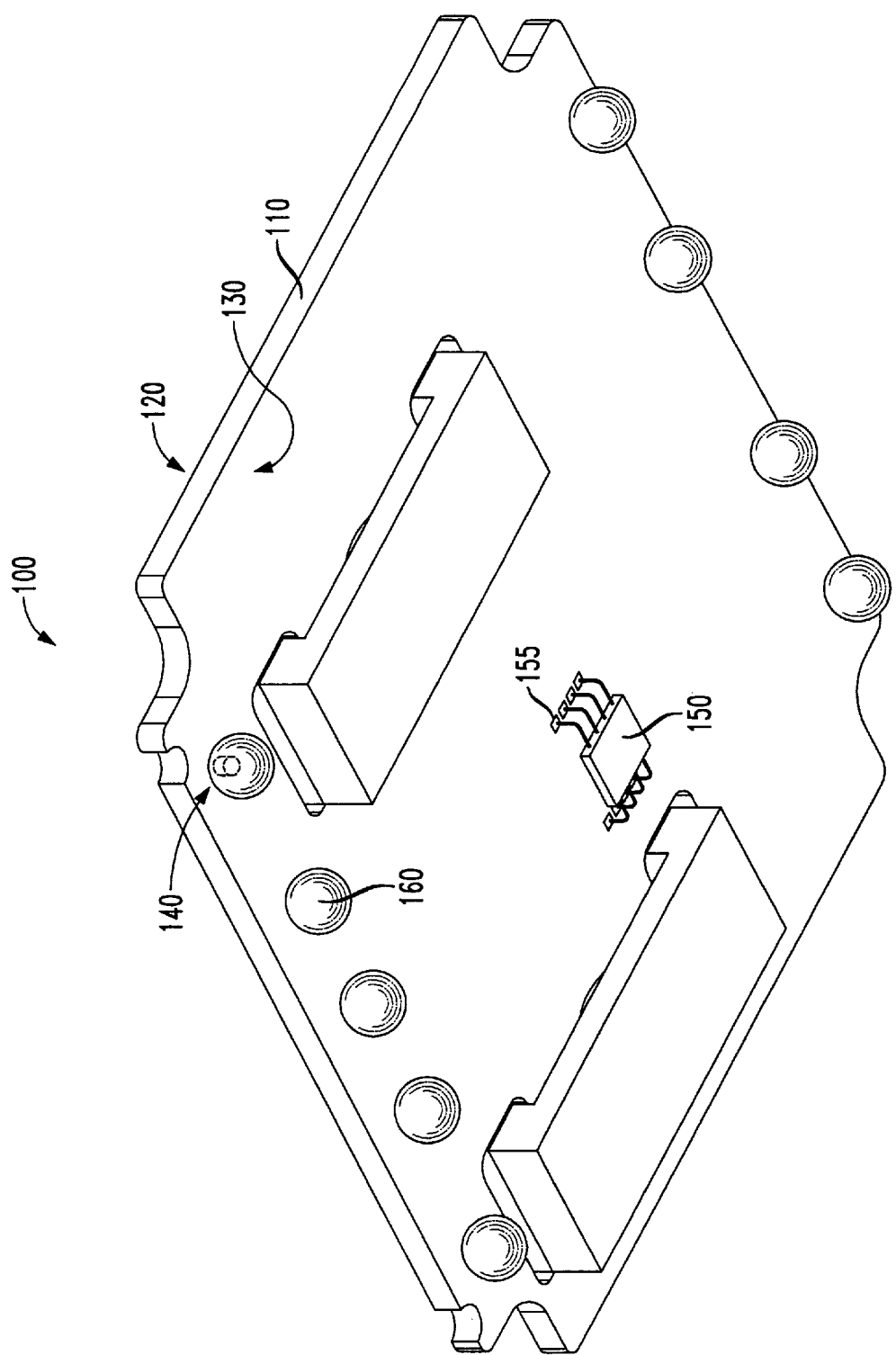
FIG. 1 illustrates an isometric view of an embodiment of a circuit board constructed in accordance with the principles of the present invention.

Referring initially to FIG. 1, illustrated is an isometric view of an embodiment of a circuit board 100 constructed in accordance with the principles of the present invention. In the illustrated embodiment, the circuit board 100 has an open frame design. Of course, other frame designs are well within the broad scope of the present invention. The circuit board 100 includes a substrate 110 having opposing upper and lower conductive layers 120, 130 and a number of vias (one of which is designated 140) coupled in electrical communication with the lower conductive layer 130. In the illustrated embodiment, the substrate 110 is a conventional epoxy-glass material such as FR4. Those skilled in the art are familiar with a variety of materials that may be employed as the substrate 110, including epoxy-glass (e.g. FR4), paper phenolic and substrates incorporating one or more metal layers.

The circuit board 100 further includes a number of electrical components (not shown) mounted on the upper conductive layer 120. The circuit board 100 further includes a number of electrical components (one of which is designated 150) having leads mounted on pads (one of which is designated 155) formed on the lower conductive layer 130. In the illustrated embodiment, the electrical components are mounted on the upper and lower conductive layers 120, 130 of the substrate 110 using a standard tin/lead (e.g., 60/40 or 63/37 Sn/Pb) solder composition. The standard tin/lead solder will transition to a liquid state as the circuit board 100 is brought to a reflow temperature, subjecting the electrical components 150 to forces capable of detaching the electrical components 150 from the substrate 110.

The circuit board 100 further includes a number of inter-substrate conductive mounts (one of which is designated 160) coupled to the lower conductive layer 130. The conductive mounts 160 have a compound curved surface thereon and are composed of a material having a melting point above a solder reflow temperature. The conductive mounts 160 are adapted to mount the circuit board 100 to an end user's circuit card or an adjacent substrate (not shown) and provide conductive paths therebetween.

In the illustrated embodiment, the conductive mounts 160 are hollow copper balls that are plated with tin/lead and are approximately 125 mil in diameter. The illustrated copper balls are manufactured by Ball Chain Manufacturing Co. of Mount Vernon, N.Y. and by Bead Industries of Bridgeport, Conn. In an alternative embodiment of the present invention, the conductive mounts 160 may be solid balls composed of high temperature lead-free solder. Those skilled in the art realize, of course, that the conductive mounts 160 of the present invention may be other geometries and manufactured from any material having a melting point above the solder reflow temperature.

In the illustrated embodiment, the conductive mounts 160 are of a sufficiently low weight such that a surface tension of a liquid state of the solder is sufficient to maintain the conductive mounts 160 in contact with the vias 140 as the solder is subjected to a temperature (e.g., 220° C.) sufficient to transition it to the liquid state during the reflow soldering process. The circuit board 100, therefore, can be surface mounted to an end user's circuit card with the reflow soldering process.

Figure 2:
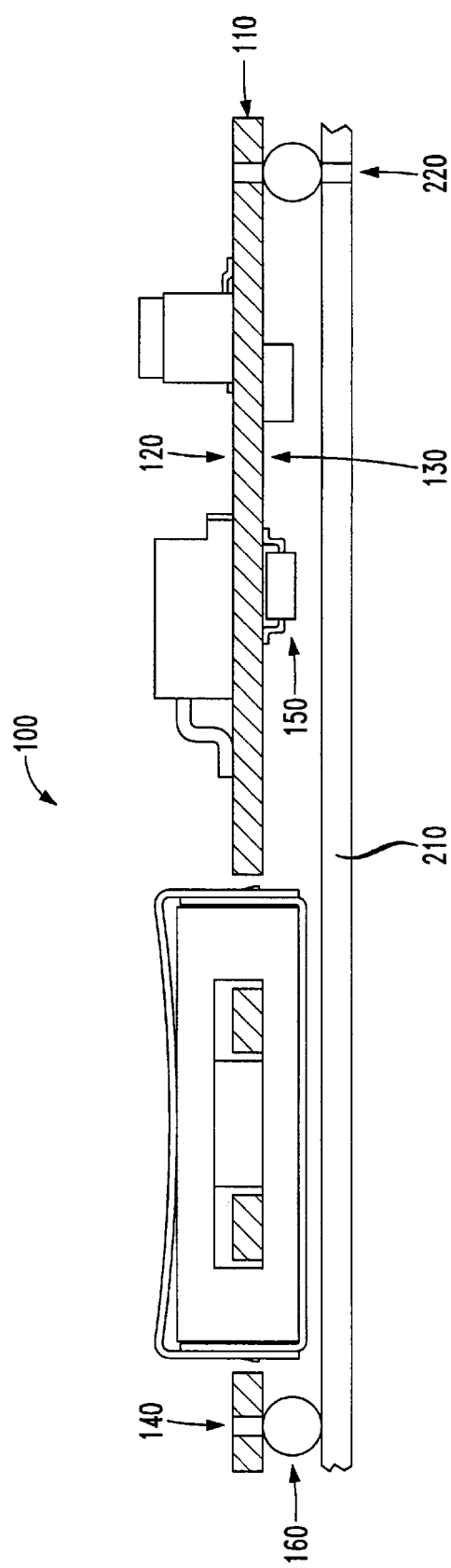
FIG. 2 illustrates a side cut away view of the circuit board of FIG. 1.

Turning now to FIG. 2, illustrated is a side cut away view of the circuit board 100 of FIG. 1. The circuit board 100 is mounted to an end user's circuit card 210 using the copper balls as conductive mounts 160. In the illustrated embodiment, the vias 140 are circular vias that provide an interconnection between the upper and lower conductive layers 120, 130 of the substrate 110. Of course, the vias 140 need not be circular. The conductive mounts 160 may, preferably, be surface mounted to the substrate 110 at the vias 140. The geometric simplicity of the copper balls advantageously allows the conductive mounts 160 to be placed on the vias 140 in any orientation, the vias 140 assisting in centering or locating the conductive mounts 160 thereon. While the vias 140 need not be circular, a shape of the vias 140 should, in a preferred embodiment, generally corresponds to a section of the conductive mounts 160.

In the illustrated embodiment, the end user's circuit card 210 contains a via or through-hole mounting hole 210 therein. The via 210 of the end user's circuit card 210 may assist in centering or locating a corresponding conductive mount 160 of the circuit board 100, thus allowing the circuit board 100 to be readily aligned to the end user's circuit card 210.

As the conductive mounts 160 are mounted to the substrate 110 of the circuit board 100 by a reflow soldering process, solder may substantially fill the vias 140, providing a low impedance path through each via 140. Since the conductive mounts 160 may carry a large amount of current, the low impedance paths created by the solder within the vias 140 and proximate the conductive mounts 160 reduce a resistive loss attributable to the circuit board 100. While the illustrated embodiment advantageously employs the vias 140 to reduce resistive losses, other embodiments not employing the vias 140 are well within the scope of the present invention.

Figure 3A:
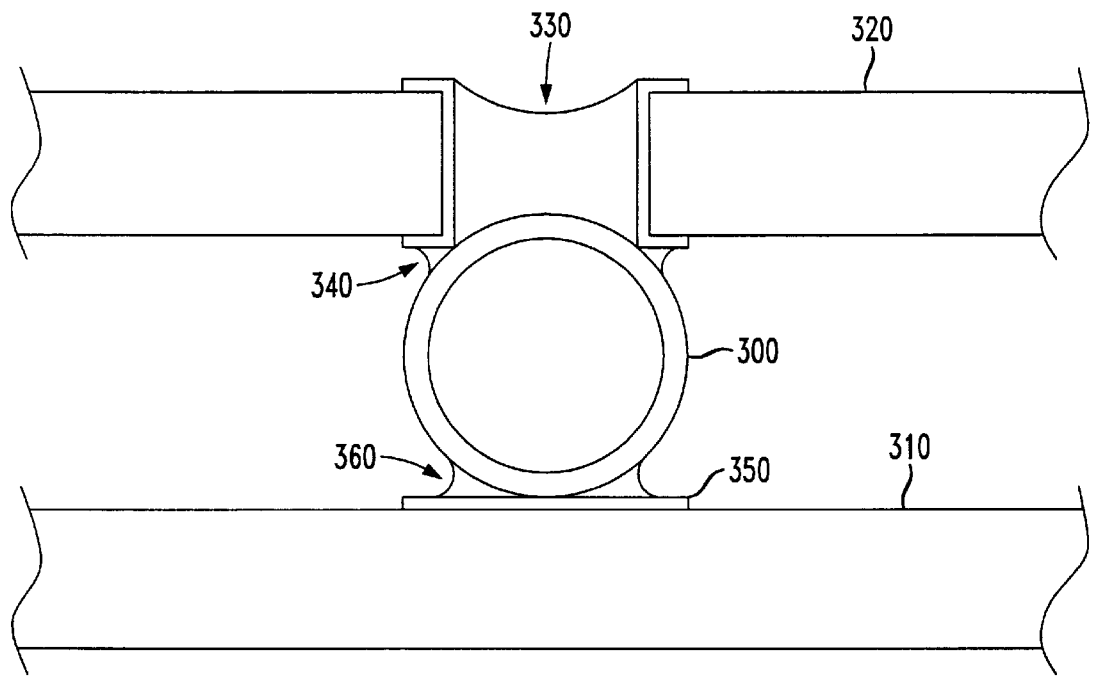
FIGS. 3A and 3B illustrate close up views of alternative embodiments of a conductive mount constructed in accordance with the principles of the present invention.
Figure 3B:
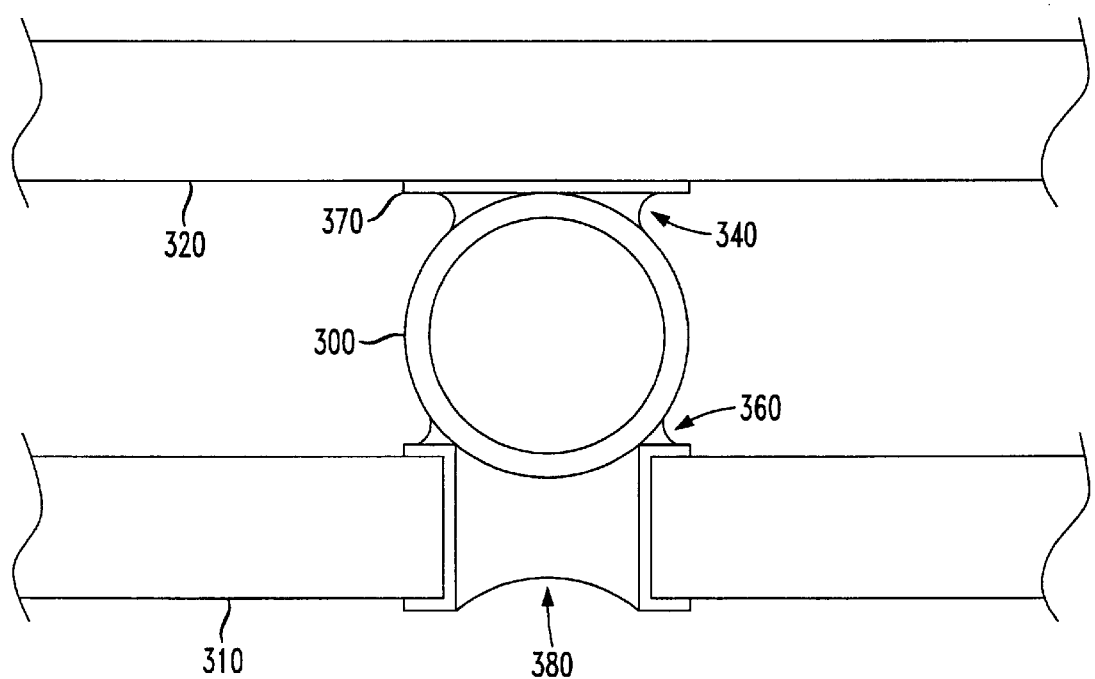

Turning now to FIGS. 3A and 3B, illustrated are close up views of alternative embodiments of a conductive mount 300 constructed in accordance with the principles of the present invention. FIGS. 3A and 3B more clearly detail the conductive mount 300 surface mounted to an end user's circuit card 310. Referring more specifically to FIG. 3A, the substrate 320 has a via 330. The conductive mount 300 is, therefore, surface mounted to the substrate 320 at the via 330 with a first solder fillet 340. The conductive mount 300 is further surface mounted to a pad 350 on the end user's circuit card 310 with a second solder fillet 360.

Turning now to FIG. 3B, the substrate 320 has a solder pad 370 instead of the via 330 of FIG. 3A. The conductive mount 300 is, therefore, surface mounted to the pad 370 with the first solder fillet 340. In the illustrated embodiment, the end user's circuit card 310 has a via or a through-hole mounting hole 380 therein. The conductive mount 300 is, therefore, surface mounted to the via 380 with the second solder fillet 360.

With continuing reference to FIGS. 3A and 3B, the via 330 of the substrate 320 and the via 380 of the end user's circuit card 310 may assist in centering and locating the conductive mount 300. Of course, neither is required by the principles of the present invention.

In the illustrated embodiments, the conductive mount 300 is a copper ball surface mounted to both the substrate 320 and the end user's circuit card 310. The conductive mount 300, therefore, provides first and second compliant solder joints (formed by first and second solder fillets 340, 360) at interfaces to the substrate 320 and the end user's circuit card 310, respectively. The first and second compliant solder joints cooperate to improve the co-planarity of the substrate 320 during the reflow soldering process.

As the substrate 320 is reflow soldered to the circuit card 310, a loss of co-planarity may develop between the substrate 320 and the circuit card 310. The substrate 320 and the circuit card 310 are typically multi-layer FR-4 or other epoxy glass material that may soften considerably at reflow temperatures and may therefore be subject to warping in three dimensions, a phenomenon sometimes referred to as "potato chipping." The warping is complex and often unpredictable. Further, the substrate 320 and the circuit card 310 may warp in different directions, causing the conductive mounts 300 to pull away from the substrate 320 or the circuit card 310. The first and second solder fillets 340, 360, however, are in a liquid state during the reflow soldering process. The surface tension and capillary action of the solder, therefore, may fill any small gaps between the conductive mount 300 and the substrate 320 or the circuit card 310 caused by the warping, thus maintaining an electrically conductive path between the substrate 320 and the circuit card 310. The first and second compliant solder joints allow the conductive mount 300 to better adapt to the relative displacement between the substrate 320 and the circuit card 310 during the reflow soldering process.

Referring again to FIG. 3A, the substrate 320 has a via 330 therein. While the via 330 is not required by the present invention, the via 330 does provide a number of advantages. During the pick-and-place process, the via 330 provides a cavity for receiving a portion of the conductive mount 300 therewithin. The cavity formed by the via 330 positively locates the position of the conductive mount 300 with respect to the substrate 320, thus improving the accuracy of the pick-and-place equipment. In the illustrated embodiment, the conductive mount 300 is partially recessed in the via 330, causing the compound curved surface of the conductive mount 300 to contact a proximal perimeter of the via 330. Displacement of the conductive mount 300 is, therefore, less likely to occur. Further, during manufacture, as the substrate 320 is being reflow soldered, the via 330 may be partially or substantially filled with solder. The solder may advantageously form a low resistance connection between the upper and lower conductive layers of the substrate 320. The via 330 further acts as a reservoir for the solder, providing solder to fill the small gaps between the conductive mount 300 and the substrate 320 or the circuit card 310 caused by warping during the reflow soldering process, as the substrate 320 is reflow soldered to the end user's circuit card 310. In the illustrated embodiment, the end user's circuit card 310 has a surface mount pad 330 for receiving the substrate 320. In the alternative embodiment, illustrated and described with respect to FIG. 3B, the end user's circuit card 310 has a via 380 in place of the surface mount pad 350 to provide advantages similar to those described with respect to the via 330.

Figure 4:
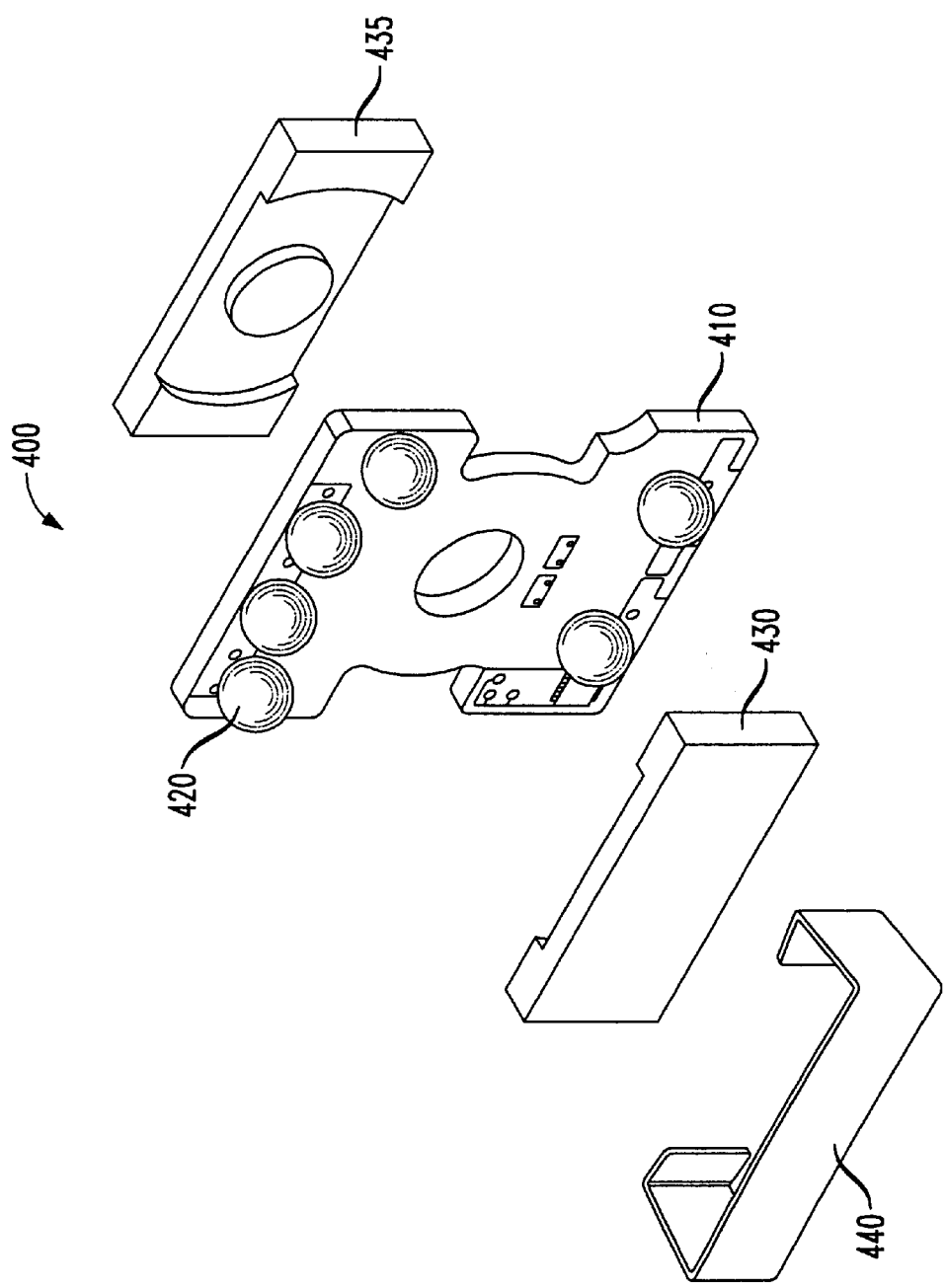
FIG. 4 illustrates an exploded isometric view of an embodiment of a power magnetic device constructed in accordance with the principles of the present invention.

While the conductive mount 300 in the illustrated embodiment is a copper ball and the via 330 is a circular hole through the substrate 320, the conductive mount 300 and via 330 may be of any geometry. For example, the conductive mount may be a hollow or solid cylinder, mounted with its longitudinal axis horizontal to a rectangularly shaped via in the substrate 320. Of course, the present invention encompasses conductive mounts of any substantially spherical, cylindrical or toroidal shape or any other shape. Alternatively, the conductive mount may have a substantially cubical or rectangular shape. In a preferred embodiment, slots may be provided in the conductive mount to for ease of soldering to the substrate 320. Turning now to FIG. 4, illustrated is an exploded isometric view of an embodiment of a power magnetic device 400 constructed in accordance with the principles of the present invention. The power magnetic device 400 includes a substrate 410 having a conductive layer and a via (not shown) coupled in electrical communication therewith. In the illustrated embodiment, the power magnetic device 400 is a transformer having windings formed from a portion of the conductive traces on the conductive layers of the substrate 410. Of course, the power magnetic device 400 may be an inductor or other power magnetic device 400. Other power magnetic devices are described in the '557 and '183 applications and in the '828 patent.

A core of the power magnetic device 400 (including first and second core halves 430, 435) is disposed through apertures of the substrate 410 and proximate the windings. The first and second core halves 430, 435 are mechanically coupled together to impart the desired magnetic property to the power magnetic device 400. In the illustrated embodiment, the power magnetic device includes a clip 440 that couples the first and second core halves 430, 435 together. The clip 440 is described by Stevens in the '935 patent. Other devices for mechanically coupling the first and second core halves 430, 435 include an automated glue process described by Roessler in the '342 and '887 applications.

The power magnetic device 400 further includes a number of inter-substrate conductive mounts (one of which is designated 420) coupled to the substrate 410. The conductive mounts 420 have a compound curved surface thereon and are composed of a material having a melting point above a solder reflow temperature. The conductive mounts 420 are adapted to mount the power magnetic device 400 to a circuit board or an end user's circuit card (adjacent substrate) and provide conductive paths therebetween.

In the illustrated embodiment, the conductive mounts 420 are hollow copper balls that are plated with tin/lead. In an alternative embodiment of the present invention, the conductive mounts 420 may be solid balls composed of high temperature lead-free solder. Of course, the conductive mounts 420 may be manufactured from any material having a melting point above the solder reflow temperature. The conductive mounts 420 are desirably of a sufficiently low weight such that a surface tension of a liquid state of the solder is sufficient to maintain the conductive mounts 420 in contact with the substrate 410 as the solder is subjected to a temperature (e.g. 220° C.) sufficient to transition it to the liquid state during the reflow soldering process. In the illustrated embodiment, the conductive mounts 420 are partially recessed in the vias, causing the compound curved surface of the conductive mounts 420 to contact proximal perimeters of the respective vias.

Figure 5:
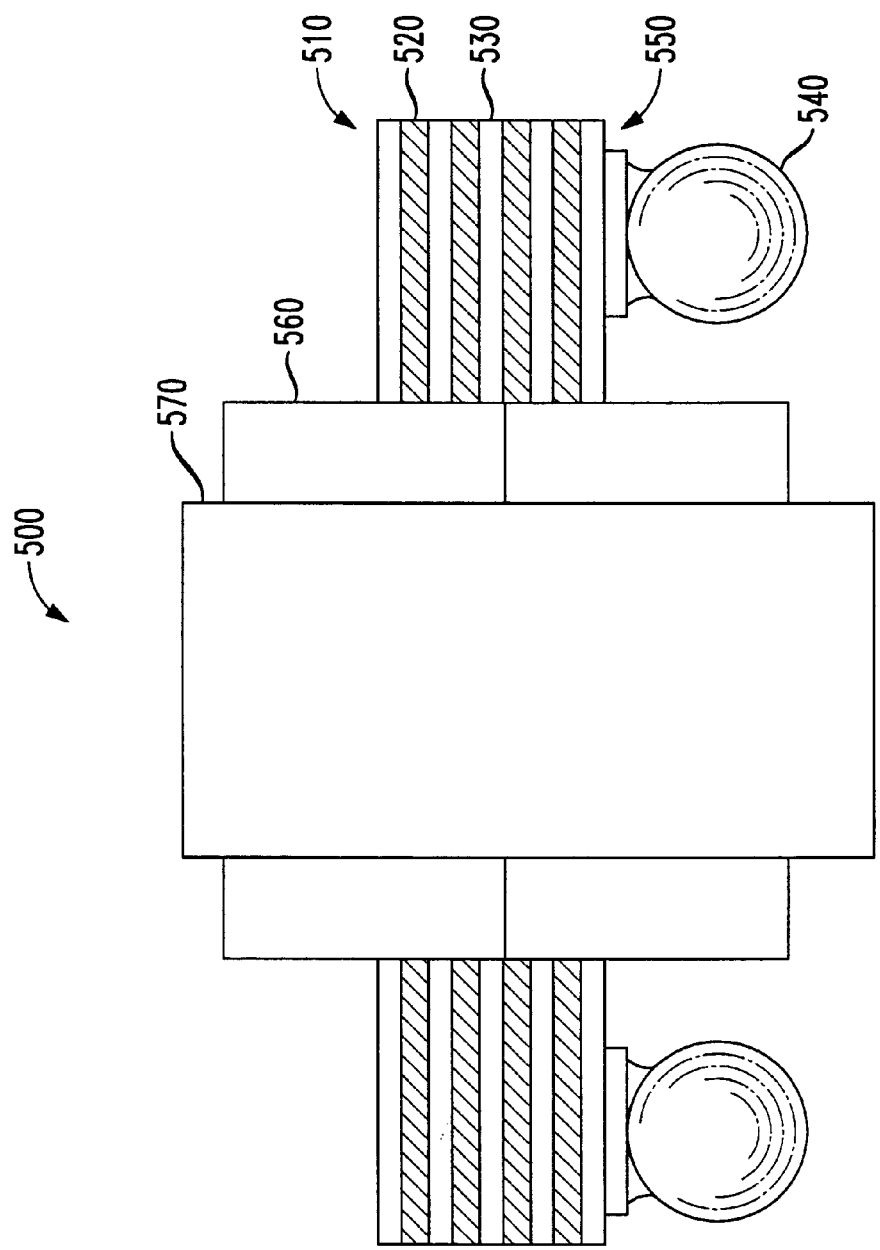
FIG. 5 illustrates another embodiment of a power magnetic device constructed in accordance with the principles of the present invention.

Turning now to FIG. 5, illustrated is another embodiment of a power magnetic device 500 constructed in accordance with the principles of the present invention. The power magnetic device 500 includes a substrate 510 having alternating conductive and insulating layers 520, 530. The windings of the power magnetic device 500 are preferably formed from a portion of the conductive layer 520. The power magnetic device 500 further includes inter-substrate conductive mounts 540 that allow the power magnetic device 500 to be surface mounted to a module (e.g., a power supply). In the illustrated embodiment, the conductive mounts 540 are soldered to respective conductive pads 550 on the substrate 510. Of course, in an alternative embodiment, the substrate 510 may have vias therein, the conductive mounts 540 being partially recessed into the vias. The power magnetic device 500 further includes a core 560, consisting of first and second core halves, disposed through the substrate 510 and proximate the windings. The power magnetic device 500 still further includes a clip 570 that mechanically couples the first and second core halves together to allow the core 560 to impart the desired magnetic property to the power magnetic device 500.

In the illustrated embodiment, the conductive mounts 520 are substantially spherical. By employing conductive mounts 520 of the appropriate shape and dimensions, the power magnetic device 500 may be directly surface mounted to an end user's existing through-hole circuit board. The end user, therefore, may employ the surface mountable power magnetic device 500 of the present invention without being required to modify the existing circuit board, thereby saving significant circuit board redesign costs.

Those skilled in the art should understand that the previously described embodiments of the inter-substrate conductive mount for the surface mountable circuit board, the surface mountable power magnetic device and related methods are submitted for illustrative purposes only and other embodiments of the inter-substrate conductive mount having two compliant solder joints are well within the broad scope of the present invention. Additionally, exemplary embodiments of the present invention have been illustrated with reference to specific electronic components. Those skilled in the art are aware, however, that components may be substituted (not necessarily with components of the game type) to create desired conditions or accomplish desired results. For instance, multiple components may be substituted for a single component and vice-versa. For a better understanding of a variety of power converter topologies employing discrete and integrated magnetic techniques, see *Modern DC-to-DC Switchmode Power Converter Circuits*, by Rudolph P. Severns and Gordon Bloom, Van Nostrand Reinhold Company, New York, N.Y. (1985); and *Principles of Power Electronics*, by John G. Kassakian, Martin F. Schlect and George C. Verghese, Addison-Wesley Publishing Company, Reading, Mas. (1991). The above-listed references are incorporated herein by reference in their entirety.

Although the present invention has been described in detail, those skilled in the art should understand that they can make various changes, substitutions and alterations herein without departing from the spirit and scope of the invention in its broadest form.

What is claimed is:

1. A surface mountable circuit board for a power supply, comprising:

a substrate having electrical components on opposing faces thereof;

an inter-substrate conductive mount composed of a material having a melting point above a solder reflow temperature and including a compliant solder joint at an interface of said substrate; and a solder located proximate said conductive mount, said conductive mount of a sufficiently low weight such that a surface tension of a liquid state of said solder is sufficient to maintain said conductive mount in contact with said substrate as said solder is brought to said reflow temperature, said conductive mount being capable of mounting said substrate to an adjacent substrate and providing a conductive path therebetween.

2. The circuit board as recited in claim 1 wherein said substrate comprises a conductive layer and a via coupled in electrical communication therewith, said conductive mount located proximate said via.

3. The circuit board as recited in claim 1 wherein said conductive mount comprises a compound curved surface thereon.

4. The circuit board as recited in claim 1 wherein said substrate is selected from the group consisting of:
   an epoxy-glass substrate;
   a paper phenolic substrate; and
   an insulated metal substrate.

5. The circuit board as recited in claim 1 wherein said conductive mount is selected from the group consisting of:
   a hollow tin/lead plated copper ball;
   a solid ball composed of high temperature solder; and
   a solid metal ball.

6. The circuit board as recited in claim 1 wherein said solder is a tin/lead solder composition, said solder transitioning to a liquid state as said circuit board is brought to said reflow temperature.

7. The circuit board as recited in claim 1 wherein ones of said electrical components are mounted on a pad on said substrate.

8. The circuit board as recited in claim 1 wherein said conductive mount is compatible with a through-hole mounting hole on an adjacent substrate, said conductive mount enabling said circuit board to be mounted to said adjacent substrate via said through-hole mounting hole.

9. The circuit board as recited in claim 1 further comprising a plurality of conductive mounts.

10. A surface mountable circuit board for a power supply, comprising:
   a substrate having electrical components on opposing faces thereof, said substrate having a conductive layer and a via coupled in electrical communication therewith;
   an inter-substrate conductive mount having a compound curved surface thereon, composed of a material having a melting point above a solder reflow temperature and recessed only partially in said via to cause said compound curved surface to contact a proximal perimeter of said via; and
   a solder located in said via and proximate said conductive mount, said conductive mount of a sufficiently low weight such that a surface tension of a liquid state of said solder is sufficient to maintain said conductive mount in contact with said via as said solder is brought to said reflow temperature, said conductive mount being capable of mounting said substrate to an adjacent substrate and providing a conductive path therebetween.

11. The circuit board as recited in claim 10 wherein said substrate is selected from the group consisting of:
   an epoxy-glass substrate;
   a paper phenolic substrate; and
   an insulated metal substrate.

12. The circuit board as recited in claim 10 wherein said conductive mount is selected from the group consisting of:
   a hollow tin/lead plated copper ball;
   a solid ball composed of high temperature solder; and
   a solid metal ball.

13. The circuit board as recited in claim 10 wherein said solder is a tin/lead solder composition, said solder transitioning to a liquid state as said circuit board is brought to said reflow temperature.

14. The circuit board as recited in claim 10 wherein ones of said electrical components are mounted on a pad on said conductive layer.

15. The circuit board as recited in claim 10 wherein said conductive mount is compatible with a through-hole mounting hole on an adjacent substrate, said conductive mount enabling said circuit board to be mounted to said adjacent substrate via said through-hole mounting hole.

16. The circuit board as recited in claim 10 further comprising a plurality of conductive mounts, said substrate comprising a plurality of vias adapted to receive corresponding ones of said plurality of conductive mounts.

* * * * *